United States Patent
Cheng et al.

(10) Patent No.: US 7,439,568 B2
(45) Date of Patent: Oct. 21, 2008

(54) VERTICAL BODY-CONTACTED SOI TRANSISTOR

(75) Inventors: Kangguo Cheng, Beacon, NY (US);
Gary B. Bronner, Stormville, NY (US);
Ramachandra Divakaruni, Ossining, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,238

(22) Filed: Feb. 10, 2005

(65) Prior Publication Data
US 2006/0175660 A1    Aug. 10, 2006

(51) Int. Cl.
*H01L 27/108*    (2006.01)
*H01L 29/76*    (2006.01)
*H01L 29/94*    (2006.01)
*H01L 31/119*    (2006.01)

(52) U.S. Cl. .............................. 257/301; 257/E27.093; 257/E21.396

(58) Field of Classification Search ................. 257/329, 257/330, 306, 296, 301–304, 298, E27.031, 257/E27.038, E27.042, E27.09, E27.092, 257/E27.093, E29.346, E21.396, E21.649
See application file for complete search history.

(56) References Cited

U.S. PATENT DOCUMENTS

| | | |
|---|---|---|
| 5,606,188 A | 2/1997 | Bronner et al. |
| 6,426,252 B1 | 7/2002 | Radens et al. |
| 6,429,477 B1 | 8/2002 | Mandelman et al. |
| 6,566,177 B1 | 5/2003 | Radens et al. |
| 6,750,097 B2 | 6/2004 | Divakaruni et al. |
| 2002/0066925 A1* | 6/2002 | Gruening et al. ............ 257/329 |

* cited by examiner

*Primary Examiner*—Theresa T. Doan
*Assistant Examiner*—Dilinh Nguyen
(74) *Attorney, Agent, or Firm*—Daryl Neff; Joseph P. Abate

(57) ABSTRACT

A vertical field effect transistor ("FET") is provided which includes a transistor body region and source and drain regions disposed in a single-crystal semiconductor-on-insulator ("SOI") region of a substrate adjacent a sidewall of a trench. The substrate includes a buried insulator layer underlying the SOI region and a bulk region underlying the buried insulator layer. A buried strap conductively connects the SOI region to a lower node disposed below the SOI region and a body contact extends from the transistor body region to the bulk region of the substrate, the body contact being insulated from the buried strap.

6 Claims, 12 Drawing Sheets

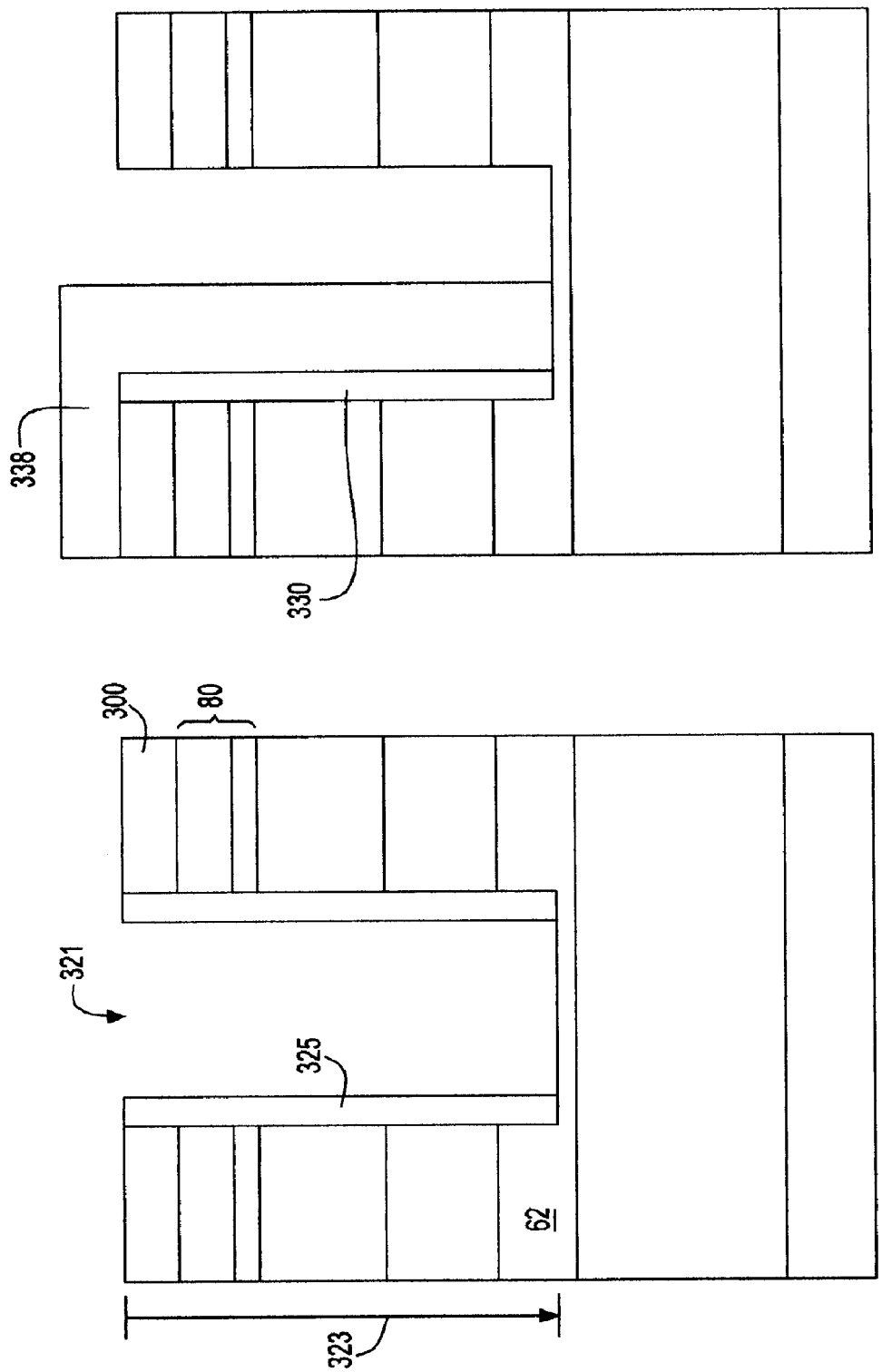

VERTICAL BODY-CONTACTED SOI TRANSISTOR

BACKGROUND OF THE INVENTION

The present invention relates to semiconductor devices and processing, and more particularly to a structure and method of fabricating a vertically oriented transistor in a silicon-on-insulator layer, the transistor having a body contact.

Speed is a key aspect of operational performance of integrated circuits. In recent years, enhanced fabrication techniques including silicon-on-insulator (SOI) technology have been introduced. SOI technology is becoming increasingly important since it assists in lowering the capacitance of transistors, enabling greater switching speeds. When field effect transistors ("FETs") are formed in bulk substrates, the junction between the "body" of the transistor (i.e., the portion of the transistor including the transistor channel that is disposed immediately adjacent to the gate dielectric) and the semiconductor material adjacent to the body results in significant capacitance. In SOI substrates, active devices such as field effect transistors (FETs) are formed in a relatively thin layer of semiconductor material (Si) overlying a buried layer of insulating material such as a buried oxide (BOX). SOI technology eliminates the junction capacitance by electrically isolating the body of the transistor from the bulk region of the semiconductor substrate. The BOX layer, the gate dielectric, the source and drain regions, and sometimes additional isolations such as shallow trench isolation (STI) regions electrically isolate the body of the SOI FET.

The electrically isolated body of a transistor formed in an SOI substrate is known as a "floating body" because the body floats at a potential which varies according to various conditions in which the transistor is operated, wherein such potential is usually not known in advance. In consequence, the threshold voltage $V_T$ of the transistor is subject to variation, also to an extent that is usually not known in advance. The threshold voltage $V_T$ is the voltage at which a FET transitions from an 'off' state to an 'on' state. FETs are fabricated as either n-channel type FETs (NFETs) or p-channel type FETs (PFETs). Whether the FET is a PFET or an NFET, the floating body of a FET constructed in an SOI substrate may cause the threshold voltage of the FET to vary somewhat over time.

While such variations in the threshold voltage are usually tolerable when the FET is used in a digital switching element such as an inverter or logic gate, FETs used in many applications, such as passgates of DRAM cells need to have a stable threshold voltage.

In a particular example, the floating body may cause the threshold voltage of the NFET to increase, causing the NFET to switch on late for rising signal transitions and early in the case of falling signal transitions. When such NFET is used as the passgate of a DRAM storage cell, the late switching NFET can weaken the signal being stored to the storage cell during writing, as well as weaken the output signal of the storage cell during reading.

In another example, the floating body may cause the threshold voltage of the NFET to decrease. When such NFET used in a storage cell of a DRAM is turned off, the gate of the NFET must be maintained at a voltage which is lower than before to keep leakage current acceptably low. For example, the gate voltage can be maintained at a negative value when the NFET is turned off.

A body contact is an electrically conductive contact made to the body of the transistor to provide, inter alia, a path for the flow of charge carriers to and from the transistor body. A proper body contact can eliminate floating body problems by maintaining the transistor body at a constant potential. DRAM cells can include planar, vertical or hybrid transistors, the hybrid transistors being similar to both planar and vertical transistors. U.S. Pat. No. 5,606,188 to Bronner et al. and U.S. Pat. No. 6,429,477 to Mandelman et al. describe DRAM cells in which a body contact is provided to a planar SOI FET.

In a particular type of DRAM storage cell array, FETs used as passgates have conduction channels which are oriented in a vertical direction along a sidewall of a deep trench, the deep trench extending between an upper surface of the SOI region, through the BOX layer and into the bulk region of the substrate. Heretofore, such FETs, referred to as "vertical FETs", disposed in SOI substrates have not been fabricated to have body contacts. Because vertical FETs in SOI substrates according to the prior art do not have body contacts, they suffer from the aforementioned floating body problems.

SUMMARY OF THE INVENTION

According to one aspect of the invention, a vertical field effect transistor ("FET") is provided which includes a transistor body region and source and drain regions disposed in a single-crystal semiconductor-on-insulator ("SOI") region of a substrate adjacent a sidewall of a trench. The substrate includes a buried insulator layer underlying the SOI region and a bulk region underlying the buried insulator layer. A buried strap conductively connects the SOI region to a lower node disposed below the SOI region and a body contact extends from the transistor body region to the bulk region of the substrate, the body contact being insulated from the buried strap.

According to another aspect of the invention, a method is provided for fabricating a vertical field effect transistor which includes a transistor body region and source and drain regions disposed in a single-crystal semiconductor-on-insulator ("SOI") region of a substrate adjacent a sidewall of a trench. The substrate includes a buried insulator layer underlying the SOI region and a bulk region underlying the buried insulator layer. A buried strap conductively connects the SOI region to a lower node disposed below the SOI region and a body contact extends from the transistor body region to the bulk region of the substrate, the body contact being insulated from the buried strap.

BRIEF DESCRIPTION OF THE DRAWINGS

FIGS. 18 through 24 are sectional views illustrating a vertical FET structure and a method of fabricating a body-contacted vertical FET in accordance with a third embodiment of the invention.

DETAILED DESCRIPTION

In view of the aforementioned floating body problems, a vertical FET formed in an SOI substrate is provided herein which includes a body contact. In such vertical FET, a body contact is provided which extends along a sidewall of a trench between the SOI region of the substrate and a p-well of the bulk region of the substrate.

Figure 1:
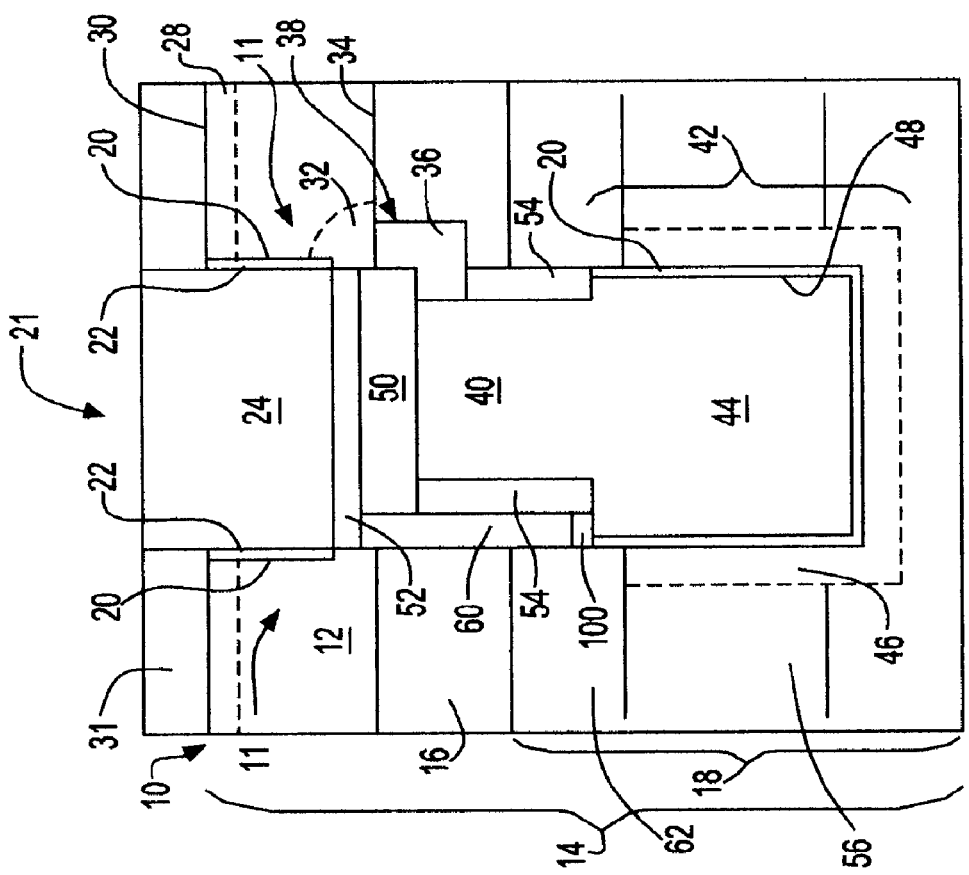

FIG. 1 illustrates a first embodiment of the invention in which a vertical FET 10 has a transistor body region 111 which is disposed in a single-crystal semiconductor-on-insulator (SOI) region 12 of a substrate 14 along a sidewall 20 of a deep trench 21. The substrate is preferably a semiconductor-on-insulator substrate, in which a SOI region 12 uniformly overlies a buried insulator layer 16, which in turn is disposed over a bulk single-crystal semiconductor region 18 of the SOI substrate. Alternatively, the SOI region 12 can be provided as a patterned SOI region of a substrate, as described in commonly owned U.S. Pat. No. 6,750,097 to Divakaruni et al., the disclosure of which is hereby incorporated by reference herein.

Preferably, the SOI region 12 and the bulk semiconductor region 18 of the substrate consist essentially of silicon and the buried insulator layer consists essentially of silicon dioxide, in which case it is referred to as a "buried oxide" or "BOX" region. Various methods can be utilized to form the SOI and BOX regions of the substrate, which are beyond the scope of the present disclosure. As further shown in FIG. 1, the FET 10 includes a gate insulator 22 disposed along the sidewall 20 of the trench 21, and a gate conductor 24 disposed within the trench 21 opposite the transistor body 11. In one embodiment, the sidewall 20 of the trench 21 presents a closed, substantially cylindrical interior surface. When the trench is viewed in a top-down plan view from above the major surface 30 of the trench 21, the opening of the trench may be circular (FIG. 2), oval, octagonal, square, rectangular (FIG. 3), or any other shape.

Referring again to FIG. 1, the FET is preferably an n-type FET or "NFET", in which the transistor body region 11 is coextensive with a p-type doped well or "p-well" in the SOI region 12. The NFET includes an n-type doped drain region 28 disposed near a top surface 30 of the SOI region 12 and an n-type doped source region 32 disposed near a bottom surface 34 of the SOI region. Preferably, an insulating layer referred to as an "array top oxide" 31 or "ATO" overlies the drain region 28 of the transistor 10. The source region 32 is preferably formed as an outdiffusion region from an n-type doped buried strap 36 which is disposed in a hole 38 within the BOX region 16 of the substrate 14.

As further shown in FIG. 1, the buried strap 36 provides a conduction path between the source region 32 of the FET and a lower node 44 or "node electrode" within the trench 21. Together, the buried strap 36 and the lower node 44 provide a conduction path between the source region 32 of the FET 10 and a capacitor 42 having a capacitor dielectric 48 disposed along a sidewall 20 and bottom 96 of the trench 21 at a location below, i.e., more deeply within the substrate 14 than the FET 10. The capacitor 42 includes a first plate 44 which is disposed opposite a capacitor dielectric 48 from a second plate, e.g., a "buried plate" 46 provided as an n-type doped region within the bulk region 18 of the substrate. The first plate 44 is conductively connected to and merges with a conductor portion 40 in the trench 21 to form a "lower node". Hereinafter, references to "lower node 44" are intended to mean either the first plate or this merged structure which includes the first plate and the conductor portion. Preferably, the buried plate 46 is conductively connected to the buried plates of other trench capacitors disposed in the substrate 14 by a laterally extending n-type doped region referred to as an "n-band" 56.

As further shown in FIG. 1, a first trench top oxide ("TTO") 50 and a second TTO 52 electrically isolate the lower node 44 including the conductor portion 40 from the gate conductor 24 which overlies the lower node within the trench 21. Further isolation of the lower node is provided by an insulating nitride liner or "collar" 54 which is disposed within the trench 21.

A body contact 60 is provided as a p-type doped region of polysilicon which extends between the p-well transistor body region 12 and a p-well region 62 disposed in the bulk region 18 of the substrate, thus providing a conduction path between the transistor body region 12 and the bulk region 62. As particularly shown in FIG. 1, the body contact 60 is provided in a deposited region of polysilicon disposed only along a first portion of the sidewall 20 of the trench 21, such portion which can be referred to as being disposed along a first "side" of the trench sidewall 20. On the other hand, the buried strap 36 is disposed only along a second portion of the sidewall 20 of the trench 21 opposite the first portion. This second portion of the sidewall can be referred to as being only along a second "side" of the trench 21.

As stated above, the lower node 44 is insulated from the body contact 60 by the collar 54 and the TTO 50. The buried strap 36 is insulated from the body contact 60 by the BOX region 16, because the hole 38 in which the buried strap is disposed does not extend to the first portion of the trench sidewall 20. The BOX region 16 therefore prevents conductive contact between the buried strap 36 and the body contact 60.

Figure 2:
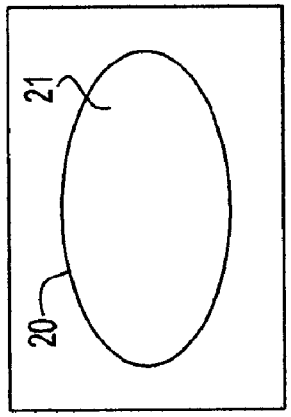
FIGS. 1 through 13 are sectional views illustrating a body-contacted vertical FET and a method of fabricating the vertical FET in accordance with a first embodiment of the invention.
Figure 3:
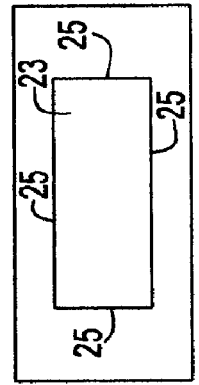

The above description relates to an embodiment in which the FET 10 is disposed along a substantially cylindrical sidewall 20 of a trench 21, having a top-down plan view such as shown in FIG. 2. However, in one embodiment as shown in FIG. 3, an upper portion 23 of the trench is anisotropically etched to create a rectangular shaped opening having substantially planar facets, such etching being performed after the trench is initially etched. In this case, the FET can be disposed along two or more of the substantially planar facets (sidewalls) 25 of the modified upper portion 23 of the trench. Note that various processing options allow the upper portion 23 of the trench to be made in many alternative shapes, of which many are suitable for use in the embodiments of the invention described herein.

Figure 4:
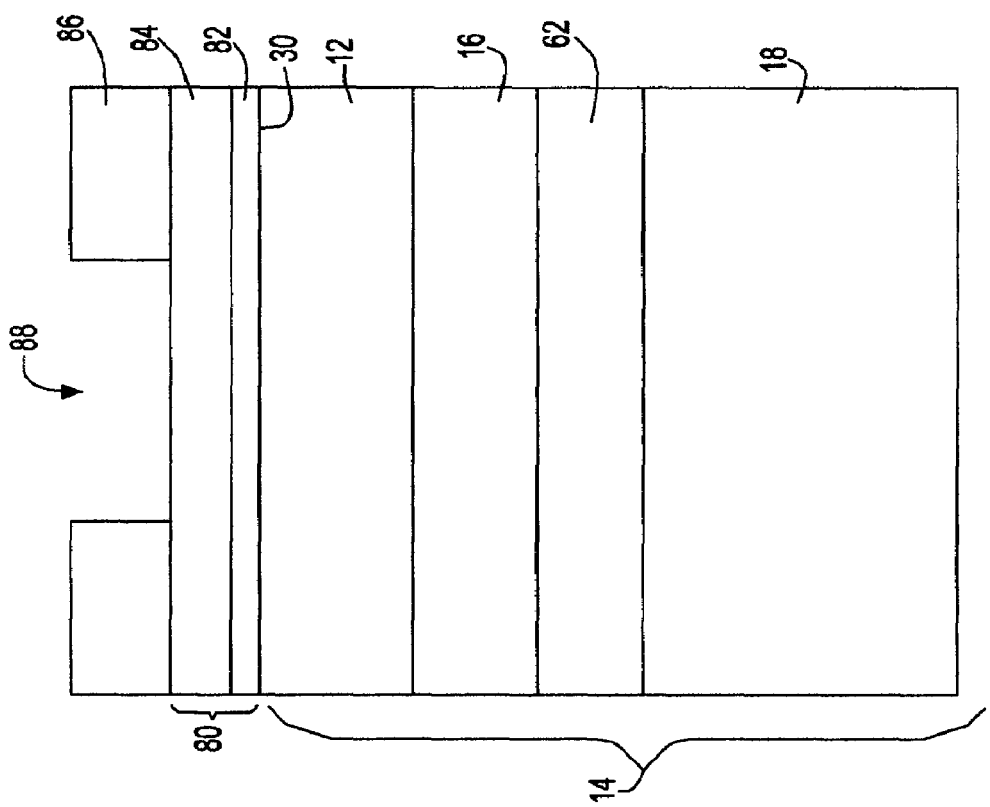

A method of forming a vertical FET in an SOI substrate according to a first method embodiment will now be described, with reference to FIG. 4 through FIG. 13. As shown in FIG. 4, in an initial stage of fabrication, an SOI substrate 14 is provided which includes an SOI region 12 overlying a BOX region 16, the BOX region overlying a p-well region 62 of the substrate which is disposed within a bulk region 18 of the substrate 14. A pad stack 80 is formed to overlie the top surface 30 of the SOI region 12, the pad stack 80 preferably including a pad oxide layer 82 of silicon dioxide, for example, contacting the top surface 30, and a pad nitride layer 84 of silicon nitride, for example, overlying the pad oxide layer 82. After the pad stack 80 is provided, a hard mask layer 86 is deposited and patterned to form an opening 88, for use in patterning a deep trench in the pad stack 80 and the underlying substrate 14.

Figure 5:
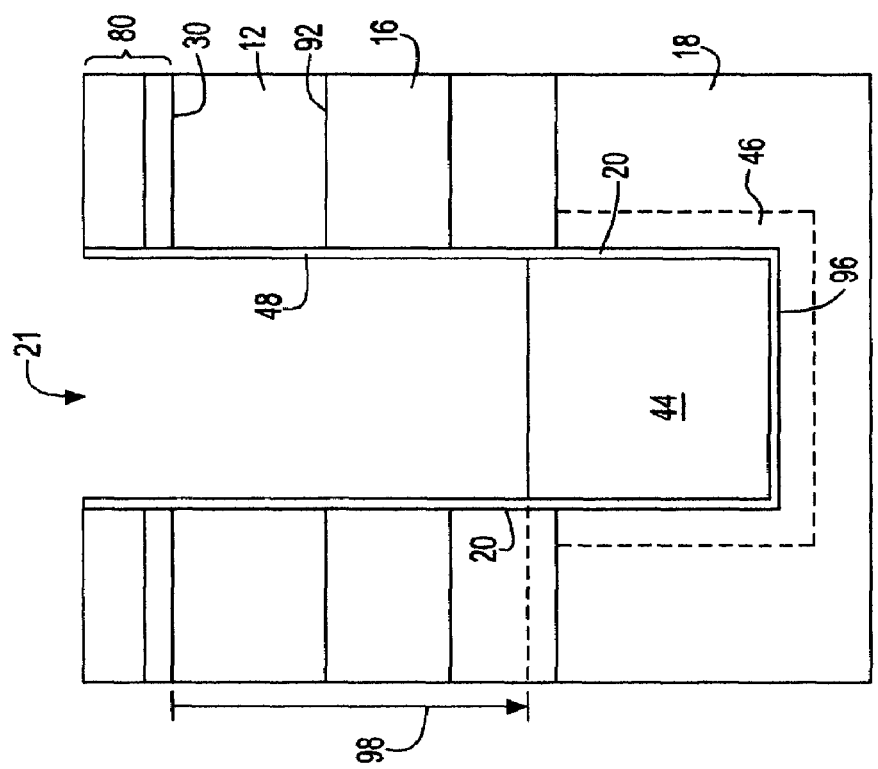

FIG. 5 illustrates a stage of processing after the deep trench 21 has been etched, and after subsequent removal of the hard mask layer 86. As shown in FIG. 5, the deep trench 21 extends downwardly through the pad stack 80, and through the SOI region 12, the BOX region 16, the p-well 62 and into the bulk region 18 of the substrate to a depth of several microns. The SOI region 12 preferably ranges in thickness from a several tens of nanometers to a few hundred nanometers, as measured from the major surface 30 of the substrate to the upper boundary 92 of the BOX region 16. The BOX region preferably has a thickness which measures from a few hundred nanometers to a few thousand nanometers.

After the deep trench 21 is etched, in one embodiment a buried plate 46 is formed in the bulk region 18 of the substrate, by diffusion of an n-type dopant source from inside the trench. Alternatively, a reference plate of the transistor is formed along the sidewall and the bottom of the trench, by any other available means. FIG. 5 shows a stage of processing after a capacitor dielectric 48 is formed to cover the sidewall 20 and bottom 96 of the deep trench 21. The capacitor dielectric is a thin dielectric film consisting essentially, for example, of silicon dioxide, silicon nitride, silicon oxynitride, or a layered stack including a plurality of layers of the aforementioned films. Alternatively, one or more films having high dielectric constants, i.e., having significantly higher permittivity than the aforementioned films, such as ferroelectric dielectric materials, perovskite materials, and zeolites, to name but a few examples, can be utilized to form the capacitor dielectric 48. Note that at the final depth of the trench, the bottom 96 of the trench may merge with the sidewall 20 such that the bottom is not identifiable separately from the sidewall. Following the formation of the capacitor dielectric 48, a plate or "lower node" 44, being a node conductor or "node electrode" is formed within the trench 21. Together, the lower node, the capacitor dielectric and the buried plate make up a capacitor dielectric disposed along the sidewall 20 of the lower portion of the trench 21. The lower node is formed, for example by depositing a heavily doped n+ type semiconductor, a metal or a combination or compound of a metal and a semiconductor and recessing the deposited material to a depth 98 below the major surface. For example, the lower node is formed by depositing heavily doped amorphous silicon and/or polycrystalline silicon, referred to herein as "polysilicon", and recessing the deposited silicon to a depth 98, as by a timed etch which etches the deposited polysilicon in preference to the capacitor dielectric 48.

Figure 6:
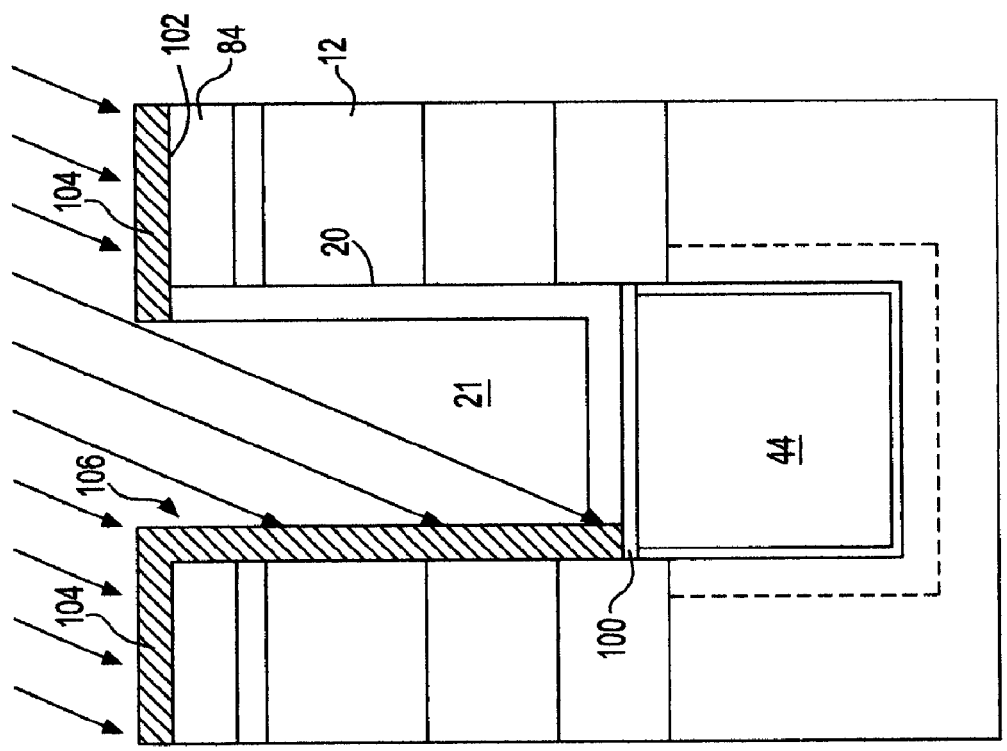

In a subsequent stage of processing shown in FIG. 6, an insulating cap 100 is formed atop the lower node 44, and a conformal layer 104 of polysilicon is deposited and implanted only along one laterally disposed portion 106 or "side" of the trench. The details of such processing are as follows. Preferably, the insulating cap consists essentially of an oxide of silicon. Hereinafter, the insulating cap is referred to as an "oxide cap". The oxide cap can be formed in a variety of ways. In one example, the capacitor dielectric is removed from the sidewall 20 above the lower node 44. This can be done by etching selectively to silicon allowing the deposited silicon in the lower node 44 to remain. The oxide cap is then formed by depositing a layer of oxide, such as by a high density plasma (HDP) technique. Such HDP deposition forms a thicker layer on horizontal surfaces such as over the lower node 44 than along the sidewall 20 of the trench. Because of that, the deposited oxide layer can be removed thereafter from the sidewall 20, as by an isotropic wet etch technique, while leaving an oxide cap 100 in place. In another example, the oxide cap 100 is formed by depositing an oxide layer by HDP technique, followed by etchback of the deposited oxide from the sidewall as above. Thereafter, the capacitor dielectric is removed from the trench sidewall 20 above the lower node, such as through an etch technique performed selective to silicon and to silicon oxide. In yet another example, the oxide cap is formed by a thermal oxidation of the polysilicon in the lower node, after which the capacitor dielectric is removed from the trench sidewall 20 above the lower node, as described above.

A layer 104 of intrinsic or at most lightly doped polysilicon is then deposited in the trench 21. In one embodiment, a conductive barrier layer (not shown) is deposited to cover the sidewall of the trench prior to depositing the layer 104 of polysilicon. In one example, the barrier layer is a "tunneling barrier layer" of silicon nitride or silicon carbide. For this purpose, a very thin (5 angstroms to 10 angstroms) layer of silicon nitride can be provided, for example. The thin nitride layer can be formed by thermal nitridation, for example. The purpose of the conductive barrier layer is to prevent the silicon crystal from growing outwardly from the SOI region 12 into the deposited layer 104 of polysilicon during processing steps in which the substrate is heated. If such growth is allowed to occur, dislocations will appear at the interface (the original trench sidewall 20) between the original SOI region 12 and the originally deposited polysilicon 104. It is undesirable to form the vertical FET in a way that incorporates the dislocations at that interface.

After depositing the conductive barrier and the polysilicon layer 104 over the conductive barrier, an angled implant is performed to dope the deposited polysilicon to a p+ type, using a source of ions such as boron or indium, for example. This results in the ions being implanted into the polysilicon on only one side 106 of the trench. This implantation is performed such that a moderately light to a relatively heavy concentration of dopants is produced in the polysilicon layer 104 along the one side of the trench. For use as a body contact, a heavy dopant concentration is desirable, but not necessary, as an effective body contact can be achieved with a moderately light dopant concentration, or any dopant concentration in between.

Figure 7:
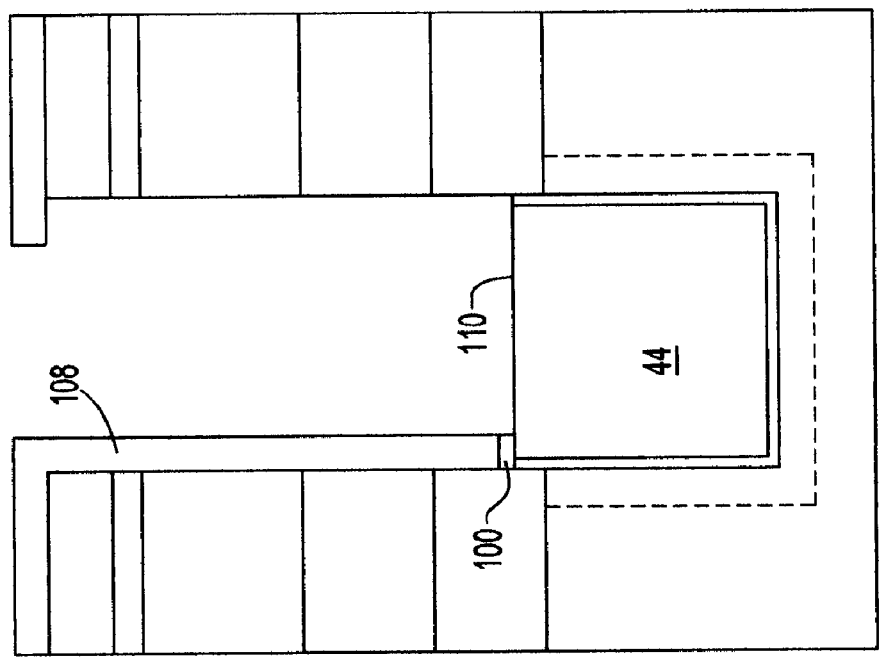
Figure 8:
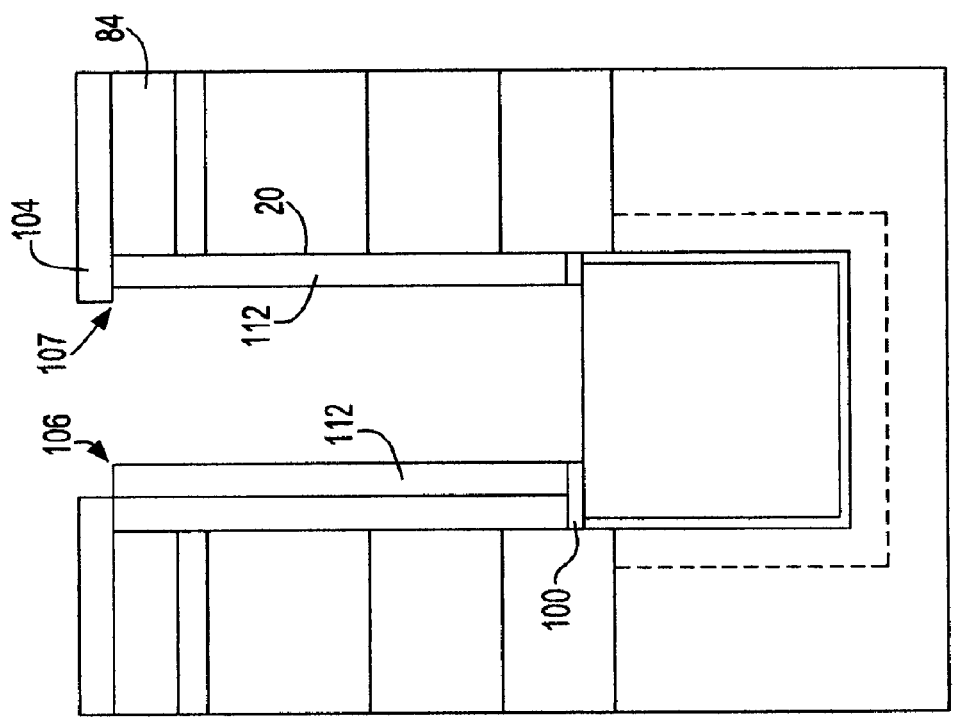

Thereafter, FIG. 7 illustrates a subsequent stage of processing after a portion of the polysilicon layer 104 which remained unimplanted from the previous stage of processing is removed, leaving only the implanted portion 108 in place. Such removal is performed, for example, by etching selectively to the implanted polysilicon material. The thin conductive barrier layer is then removed where exposed by the removal of the unimplanted portion of the polysilicon layer. This can be accomplished by etching under conditions which are selective to silicon. Thereafter, the oxide cap is removed from the exposed surface 110 of the lower node, as by etching selectively to silicon, and allowing the oxide cap 100 to remain between the doped polysilicon 108 and the lower node 44. Thereafter, as shown in FIG. 8, a conformal layer of silicon nitride is deposited and thereafter removed from the portion overlying the polysilicon layer 104 above the top surface of the pad nitride 84, as by a reactive ion etch (RIE). This results in the formation of sidewall spacers 112 along the sidewall of the two sides 106, 107 of the trench.

Figure 9:
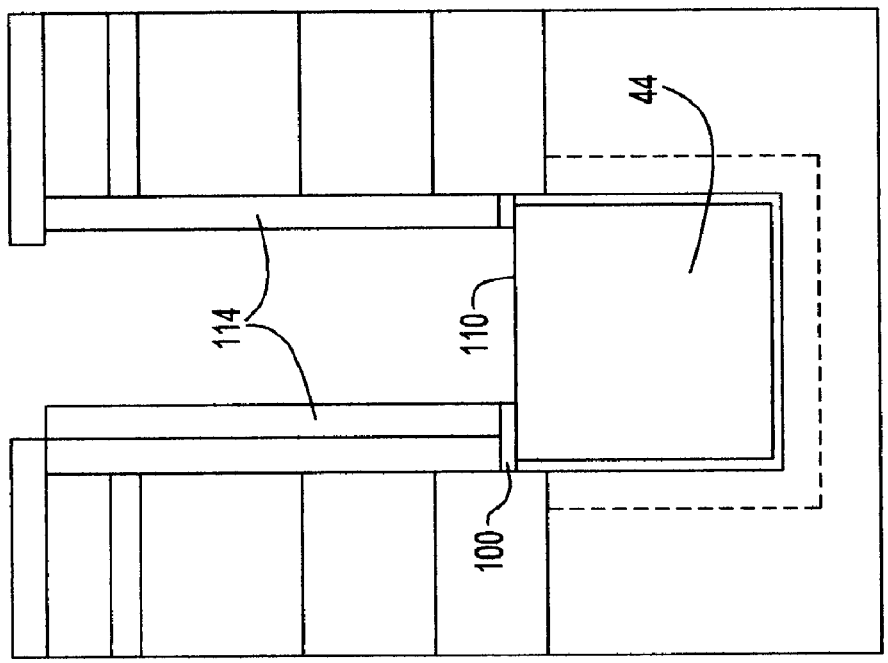

FIG. 9 illustrates an alternative process flow which can be performed in place of the processing described above with reference to FIGS. 7-8. In this process flow, silicon nitride spacers 114 are formed after the removal of the unimplanted polysilicon and the exposed portion of the conductive barrier. Thereafter, the portion of the oxide cap 100 which overlies the exposed surface 110 of the lower node 44 is removed to result in the structure shown in which the nitride spacers 114 are separated from the lower node 44 by the oxide cap 100. Hereinafter, although the subsequent figures illustrate processing in accordance with the flow shown in FIGS. 7-8, further processing can be performed after the processing shown in FIG. 9 instead.

In the subsequent stage of processing shown in FIG. 10, the trench 21 is again filled with heavily doped n+ polysilicon 116 and then recessed to a depth 94 which is below but near the upper boundary 92 of the BOX region 16. This deposited polysilicon 116 joins with the previously deposited n+ doped polysilicon so as to form a unified lower node 44 consisting essentially of n+ doped polysilicon. This also removes the previously implanted polysilicon from areas overlying the pad nitride 84, leaving a polysilicon region as a "vertical polyconductor" 118 extending upwardly along the one side 106 of the trench 21 from the p-well 62 up to the pad nitride 84. From this vertical polyconductor, a body contact will be subsequently formed.

Figure 11:
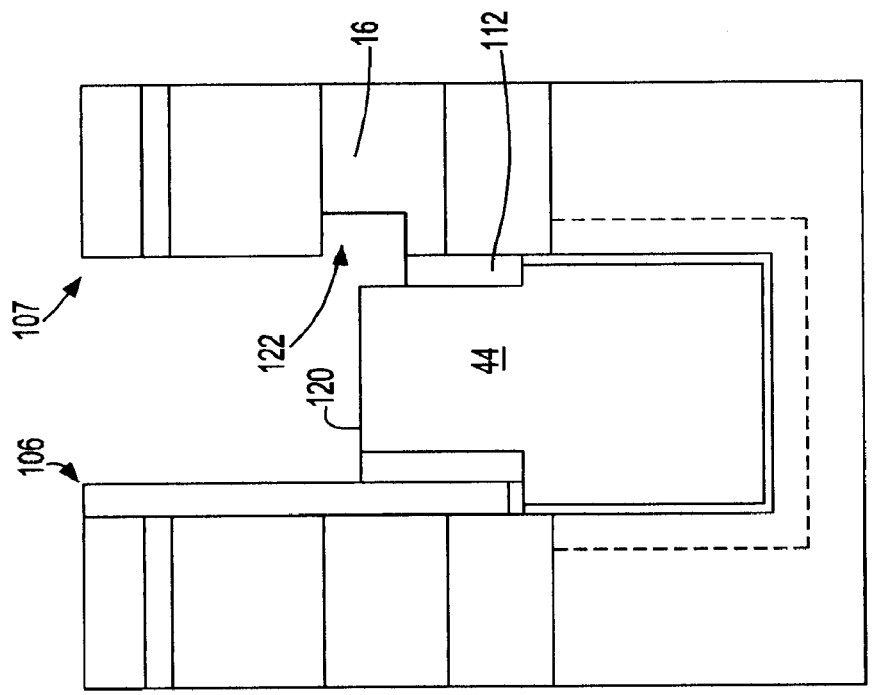
Figure 10:
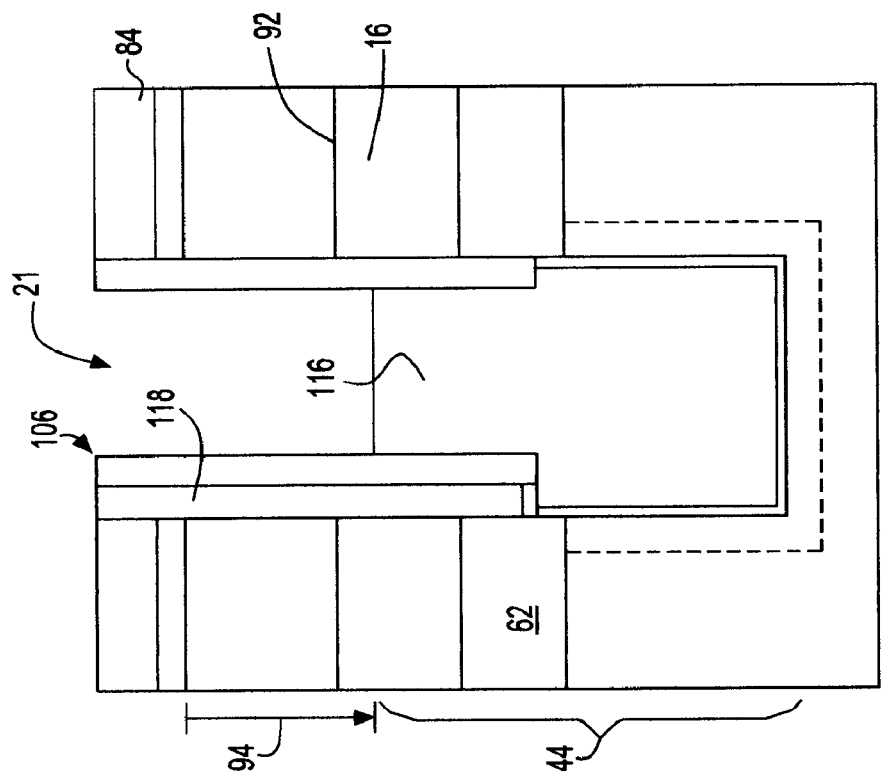

Thereafter, as illustrated in FIG. 11, processing is begun to form a buried strap along the side of the trench opposite the vertical polyconductor 118. This is performed by etching the silicon nitride spacers 112 selective to silicon, in order to stop etching after reaching the top surface 120 of the lower node 44. Thereafter, a divot 122 is formed in the BOX region 16 by etching the silicon oxide material therein under conditions which are selective to silicon and to silicon nitride, such that the divot is formed only on the side 107 of the trench that is not covered by the vertical polyconductor 118, but not on the side 106. The thus formed divot 122 partially exposes the nitride spacer 112 on the same side 107 of the trench. That exposed portion of the nitride spacer 112 is then recessed to the depth of the divot, as by etching under conditions which are selective to silicon and to silicon oxide.

Figure 12:
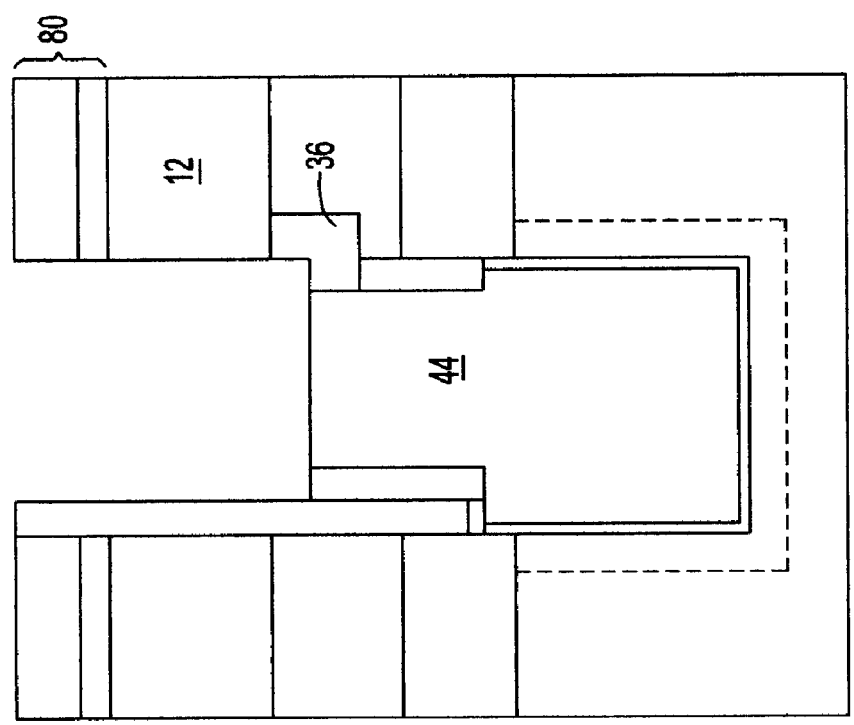

Next, doped or undoped polysilicon is deposited in the trench and then etched back to expose the trench sidewall and the pad stack 80, such that a buried strap 36 is formed in place of the divot, as shown in FIG. 12. Here, it is desirable to deposit heavily doped polysilicon as the buried strap material. However, lightly doped or undoped polysilicon will also suffice because of the proximity of the heavily doped lower node 44, which serves in a later step of heating the substrate as a source of dopant for outdiffusing through the buried strap 36 into the SOI region 12. In one embodiment, a conductive barrier layer (not shown) is formed to cover the exposed sidewall of the trench prior to depositing the buried strap 36. In one example, the barrier layer is a "tunneling barrier layer" of silicon nitride or silicon carbide, such as that provided on the trench sidewall prior to forming the vertical polyconductor, as described above. As in the conductive barrier formed under the vertical polyconductor, in this case a very thin (5 angstroms to 10 angstroms) layer of silicon nitride can be formed by thermal nitridation, for example. The purpose of the conductive barrier layer is to prevent the silicon crystal from growing outwardly from the SOI region 12 into the deposited buried strap 36 polysilicon during processing steps in which the substrate is heated. If such growth is allowed to occur, dislocations will appear at the interface between the original SOI region 12 and the originally deposited polysilicon 36. The conductive barrier is provided because it is undesirable to form the vertical FET in a way that incorporates the dislocations at that interface.

Figure 13:
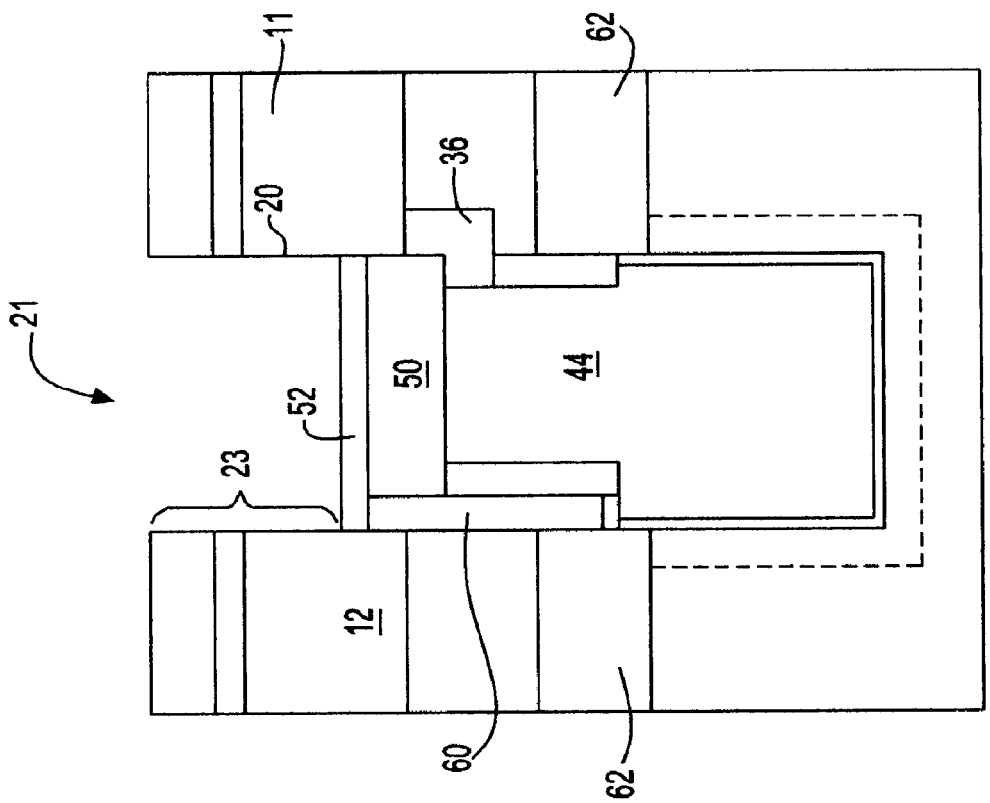

Thereafter, as shown in FIG. 13, steps are performed to isolate the lower node 44 from an upper portion 23 of the trench 21. Preferably, a first thick layer of oxide is formed over the lower node 44, the oxide being formed, for example, by plasma deposition, e.g., as by high density plasma deposition. This thick layer of oxide functions as a "trench top oxide (TTO)" 50 between the vertical polyconductor and the buried strap 36. After the TTO 50 is formed, the vertical polyconductor is removed from the upper portion 23 of the trench by isotropic or anisotropic etching. This results in the vertical polyconductor being shortened to form the final body contact 60 extending between the SOI region 12 and the p-well 62. In one embodiment, this etching process is performed anisotropically, such as by an ammonia-based etchant, which causes the shape of the upper portion 23 of the trench in a top-down plan view to more nearly resemble a rectangle, as shown in FIG. 3. When the upper trench portion 23 is changed to rectangular shape, the performance of the vertical transistor device is improved because gate dielectric layers of a subsequently formed vertical transistor 10 will be disposed along crystal planes 25 of the single-crystal SOI region 11. After the TTO 50 is formed and the body contact 60 is formed by shortening the vertical polyconductor, a layer 52 of silicon dioxide or silicon nitride is deposited into the trench 21 and etched back to form a second trench top oxide or isolation layer 52, as shown in FIG. 13. This layer 52 functions to isolate the body contact 60 from the upper trench portion 23, a task which is not achieved by TTO 50.

Thereafter, referring to FIG. 1 again, steps are performed to complete the vertical transistor 10 in the upper trench portion. Such steps include removal of the pad nitride 84 and implantation of the drain region 28 below the top surface of the SOI region 12, formation of a gate dielectric 22 along the trench sidewall 20, after which a gate conductor 24 is formed within the trench 21, the gate conductor 24 isolated from the lower node 44 by the trench top insulating layer 52 and the TTO 50. Preferably, an array top oxide 31 is also formed to overlie the SOI region 12. A thermal cycle such as an anneal is performed to activate implanted dopants in the drain region and to diffuse an n-type dopant from the buried strap 36 into a "buried strap outdiffusion region" 32 in the SOI region 12 adjacent to gate dielectric 22 to form the source region of the transistor 10. This completes processing to form a storage cell including a body-contacted vertical transistor having a one-sided buried strap 36 overlying a trench capacitor, according to a first embodiment of the invention. The body contact 60 of the vertical transistor 10 is disposed along one side of the trench 21, while the buried strap 36 is disposed along the opposite side of the trench 21.

Figure 14:
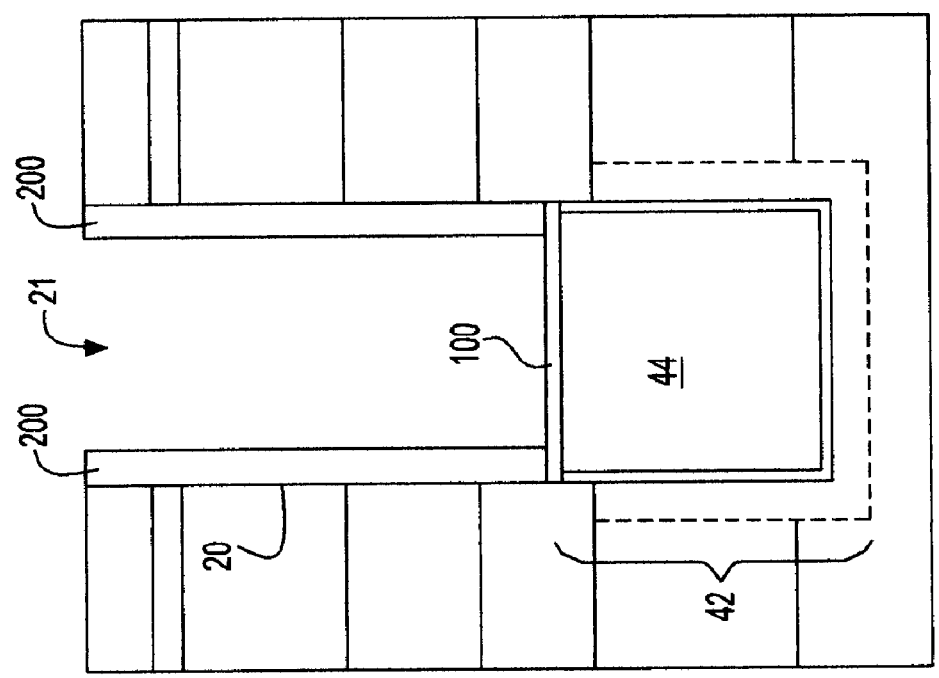

In a second process embodiment of the invention illustrated with respect to FIGS. 14 through 17, the final storage cell structure achieved is the same as that shown in FIG. 1. In this embodiment, a photolithographic masking step is used to pattern a polysilicon spacer within the trench, instead of performing an angled ion implantation and removal of unimplanted silicon as shown and described above with reference to FIGS. 6-7. In the following description, only the processing which is different from that shown and described above will be described here. Thus, FIG. 14 illustrates a stage of processing according to this embodiment after the trench capacitor 42 has been completed in the lower portion of the trench, and an oxide cap 100 is formed to overlie the lower node 44. Thereafter, doped p-type polysilicon (moderately lightly to heavily doped) is deposited and vertically etched, as by RIE, to form a vertically extending spacer 200 along the sidewall 20 of the trench. A body contact is an electrically conductive contact made to the body of the transistor to provide, inter alia, a low-resistance path for the flow of charge carriers to and from the transistor body. A proper body contact can eliminate floating body problems by maintaining the transistor body at a constant potential. As described above with reference to FIG. 7, a tunneling barrier or other thin conductive barrier (not shown) is preferably formed along the sidewall 20 of the trench prior to depositing the polysilicon.

Figure 15:
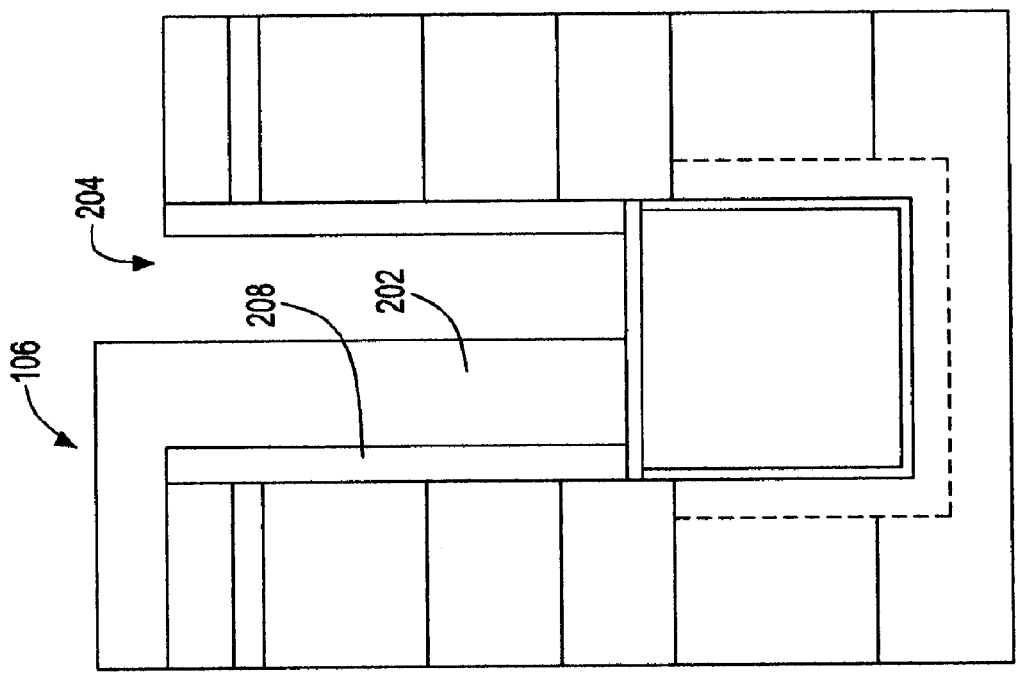
FIGS. 14 through 17 are sectional views illustrating an alternative method of fabricating a body-contacted vertical FET in accordance with a second embodiment of the invention.
Figure 17:
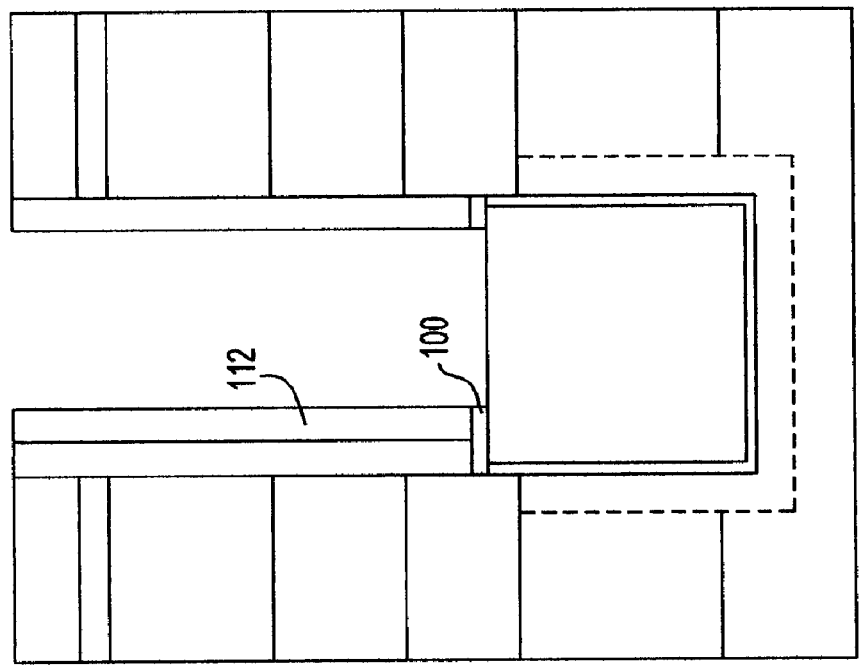
Figure 16:
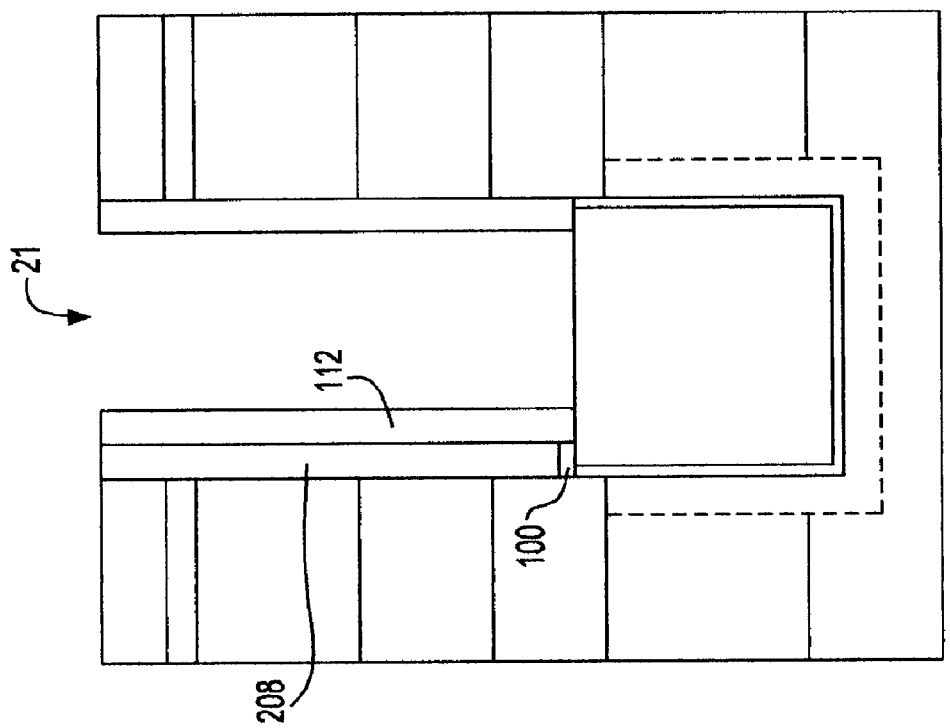

Referring to FIG. 15, a layer of photoresist 202 is deposited and thereafter photolithographically patterned to cover the polysilicon spacer 200 only on one side 106 of the trench. The spacer is then removed by etching where the spacer is exposed on the other side 204 of the trench, leaving the vertical polyconductor 208 in place along side 106. Following removal of the spacer from the one side of the trench the photoresist 202 is removed. The oxide cap 100 is then removed under conditions selective to silicon such that the cap 100 remains only under the vertical polyconductor 208, as shown in FIG. 16. Thereafter, a layer of silicon nitride is deposited and vertically etched, as by RIE to form a nitride spacer 12 inside the trench 21. Alternatively, as shown in FIG. 17, instead of etching the oxide cap 100 before forming the nitride spacer, the nitride spacer 112 can be formed prior to etching the oxide cap 100. Thereafter, further processing is performed to complete the storage cell structure including the body-contacted FET as described above with reference to FIG. 10 through 13 and FIG. 1.

A third process embodiment will now be described with reference to FIGS. 18-24. In this embodiment, a two-step reactive ion etch (RIE) process is used to pattern the trench, in a manner which allows the oxide cap 100 (FIGS. 8, 9) to be eliminated. Thus, as shown in FIG. 18, a hardmask layer 300 is deposited to overlie the pad stack 80 and patterned to form an opening, after which a trench 321 is etched to a depth 323 within the p-well region 62 of the substrate. Referring to FIG. 18, a polysilicon spacer 325 is then formed and patterned to extend along only one side of the trench 321 to form a vertical polyconductor 330 (FIG. 19), such as by photolithographic patterning using photoresist 338 (FIG. 19), in a manner such as that described above with respect to FIGS. 14-15. Thereafter (FIG. 20), a nitride spacer 327 is formed within the trench covering the vertical polyconductor 330, as well as the side 332 of the trench not having the polyconductor.

Figure 21:
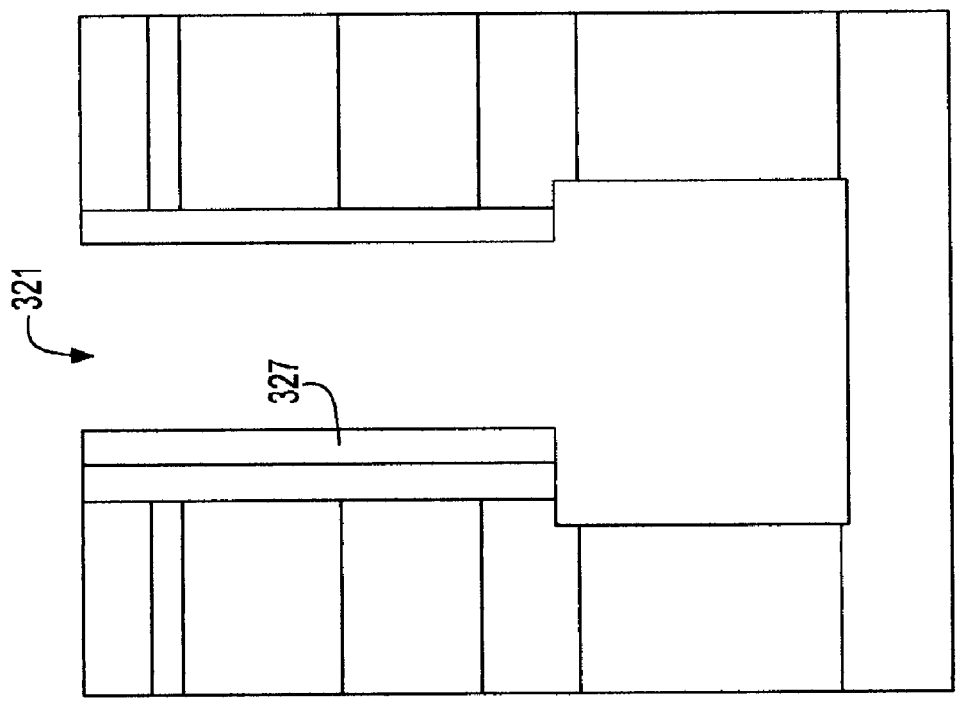
Figure 20:
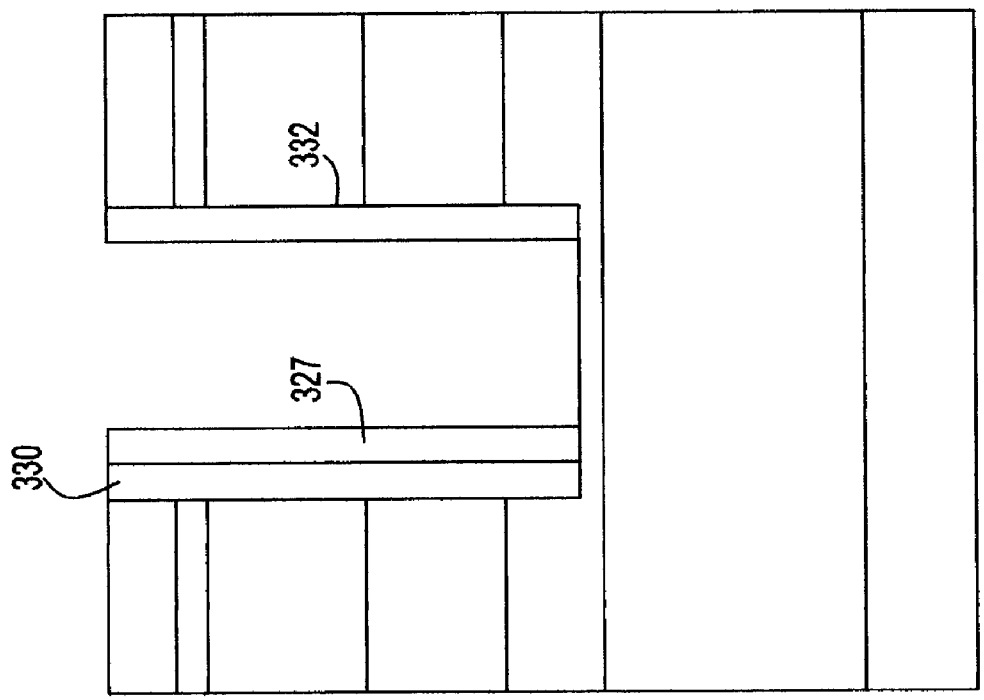
Figure 23:
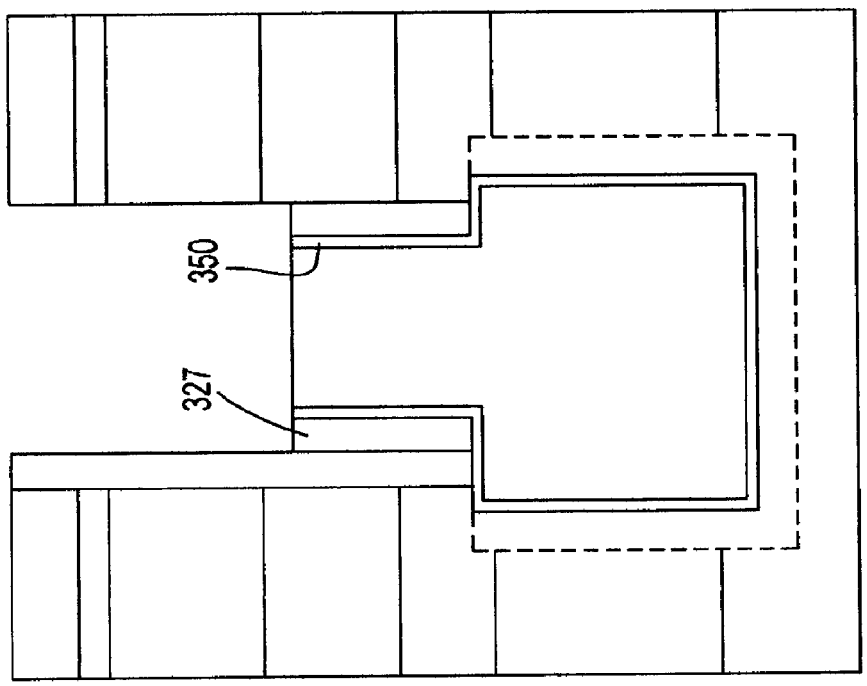
Figure 22:
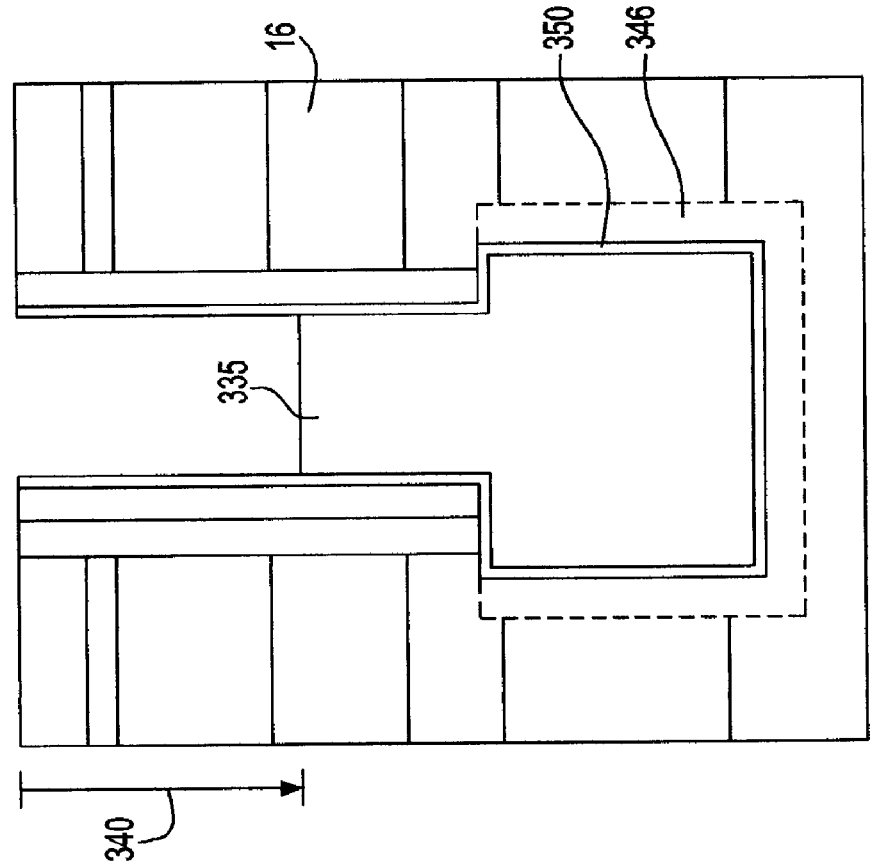

As shown in FIG. 21, the trench 321 is then etched deeply within the substrate, after which an optional trench bottling process can be performed to expand the volume of the lower portion of the trench below the nitride spacer 327, prior to forming a trench capacitor in the lower portion. Thereafter, with reference to FIG. 22, steps are performed to create a reference plate of the capacitor such as a buried plate 346, and a node dielectric 350, in a manner similar to that described above with reference to FIG. 5. Heavily doped polysilicon is then deposited within the trench and recessed to a level 340 coinciding with the BOX region 16 as a lower node 335 including the lower electrode of the trench capacitor. Then, the node dielectric 350 and the nitride spacer 327 are recessed within the trench under conditions selective to silicon, to result in the structure shown in FIG. 23.

Figure 24:
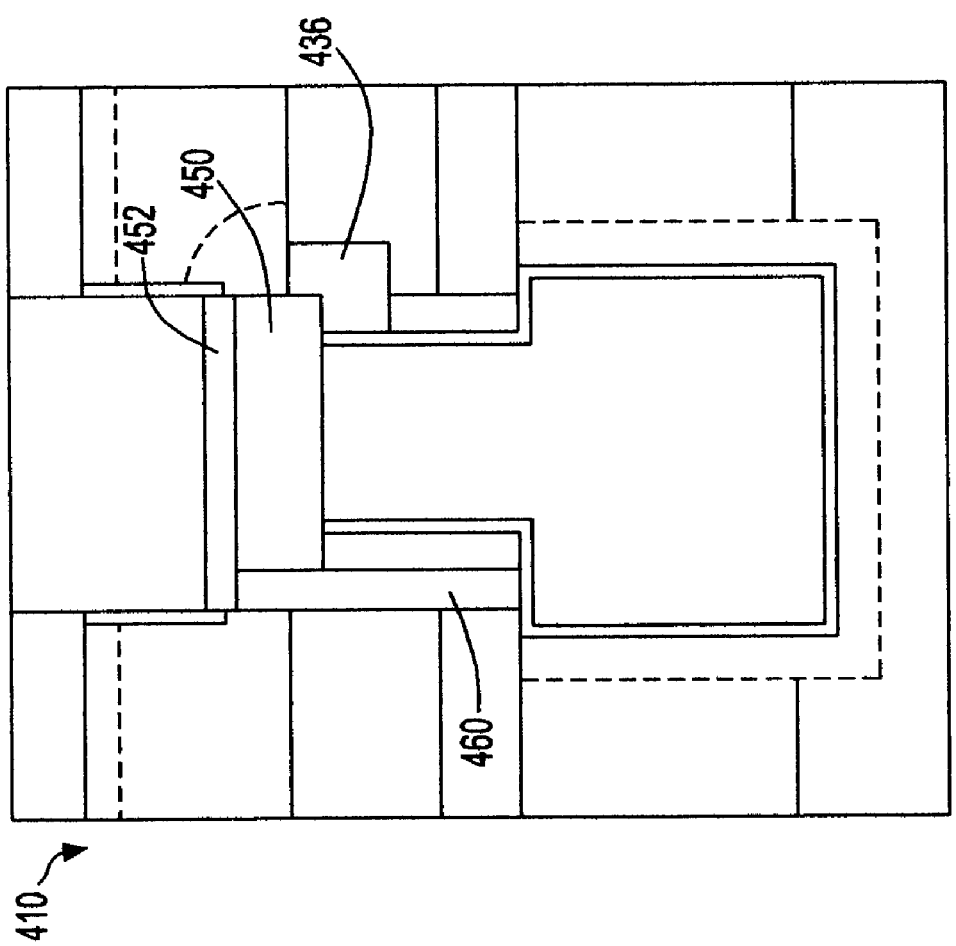

Finally, referring to FIG. 24, steps are performed to form the buried strap 436, body contact 460, and trench top oxides 450, 452 and a vertical transistor 410, in a manner as described above with reference to FIGS. 11-13 and FIG. 1.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A field effect transistor ("FET"), comprising:
   a transistor body region, a source region and a drain region, each of said transistor body region, said source region and said drain region being disposed in a single-crystal semiconductor-on-insulator ("SOI") region of a substrate adjacent to a sidewall of a trench, said substrate including a buried insulator layer underlying said SOI region and a bulk region underlying said buried insulator layer, said transistor body region being adjacent to said sidewall along a first side and a second side of said trench, said second side being opposite from said first side and across said trench from said first side, said FET further including a gate dielectric layer extending along said sidewall along said first and second opposite sides of said trench and a gate conductor disposed within said trench between said first and second opposite sides;
   a capacitor including a lower node operable as a first plate of said capacitor and a second plate separated from said lower node by a capacitor dielectric;
   a buried strap extending along said first side of said trench, said buried strap conductively connecting said drain region to said lower node;
   a trench top oxide separating said gate conductor from said lower node;
   a dielectric collar extending vertically along said sidewall between said trench top oxide and said lower node; and
   a body contact extending along said second side of said trench from said transistor body region to said bulk region of said substrate, said body contact having a vertically extending inner face contacting said dielectric collar and a vertically extending outer face remote from said inner face, wherein said outer face is in conductive communication with said SOI region and said bulk region.

2. The FET as claimed in claim 1, wherein said body contact is disposed within said trench.

3. The FET as claimed in claim 1, wherein said buried insulator layer includes a hole adjacent to said trench at least partially extending between said SOI region and said bulk region, and said buried strap is disposed in said hole.

4. The FET as claimed in claim 1, wherein said buried strap is disposed only along said first side of said trench and said body contact is disposed only along said second side.

5. The FET as claimed in claim 1, wherein said sidewall presents a multi-faceted surface having a plurality of essentially planar facets, said gate dielectric overlying and conforming to said essentially planar facets.

6. The storage cell as claimed in claim 1, wherein said body contact is insulated from said buried strap.

* * * * *